United States Patent
Nakai

(10) Patent No.: US 7,632,735 B2
(45) Date of Patent: Dec. 15, 2009

(54) PROCESS FOR MANUFACTURING SILICON-ON-INSULATOR SUBSTRATE

(75) Inventor: Tetsuya Nakai, Tokyo (JP)

(73) Assignee: Sumco Corporation, Tokyo (JP)

( * ) Notice: Subject to any disclaimer, the term of this patent is extended or adjusted under 35 U.S.C. 154(b) by 402 days.

(21) Appl. No.: 11/541,385

(22) Filed: Sep. 29, 2006

(65) Prior Publication Data
US 2007/0077718 A1 Apr. 5, 2007

(30) Foreign Application Priority Data
Oct. 4, 2005 (JP) .............................. 2005-290705

(51) Int. Cl.
*H01L 21/76* (2006.01)

(52) U.S. Cl. ........................ 438/407; 438/423; 438/528; 257/E21.563

(58) Field of Classification Search ................. 438/407, 438/423, 528
See application file for complete search history.

(56) References Cited

U.S. PATENT DOCUMENTS
2005/0202600 A1* 9/2005 Yamashita .................. 438/149

FOREIGN PATENT DOCUMENTS
JP 2004-193185 7/2004

* cited by examiner

*Primary Examiner*—Jack Chen
(74) *Attorney, Agent, or Firm*—Kolisch Hartwell, P.C.

(57) ABSTRACT

A process for manufacturing a silicon-on-insulator substrate comprising a single-crystal silicon substrate in which an oxide layer has been locally buried includes forming a step on the silicon substrate so that a region corresponding to the oxide layer has a greater surface height than other regions; then implanting oxygen ions in the silicon substrate so as to form the oxide layer.

3 Claims, 2 Drawing Sheets

PROCESS FOR MANUFACTURING SILICON-ON-INSULATOR SUBSTRATE

BACKGROUND OF THE INVENTION

1. Field of the Invention

The present invention relates to a process for manufacturing a silicon-on-insulator substrate having a structure in which an oxide layer is locally buried within a silicon substrate.

Priority is claimed on Japanese Patent Application No. 2005-290705, filed Oct. 4, 2005, the content of which is incorporated herein by reference.

2. Description of Related Art

Silicon-on-insulator (SOI) substrates in which an oxide layer, i.e., an insulator layer made of oxide known as a buried oxide (BOX) layer, has been buried at the interior of a silicon substrate by the local implantation of oxygen ions in a single-crystal silicon substrate and annealing treatment involving the application of a given amount of heat have attracted attention in recent years as semiconductor substrates for high-performance transistors. One known application for such SOI substrates is the partial SOI substrate in which a region corresponding to the BOX layer (referred to below as the "SOI region") is locally formed at the interior of the substrate. The partial SOI substrate is of value in system LSIs having integrated thereon, for example, analog, logic and memory functionality because such a substrate makes it possible to form only logic circuits in the SOI region and to form memory circuits in other regions (referred to below as the "bulk regions").

However, when a substrate having such a SOI structure is manufactured, there is a risk that, in the course of forming the BOX layer in annealing treatment, the volume of the BOX layer will expand, causing the surface of the substrate to swell and create a "step." When semiconductor devices are formed on the surface of a substrate having such steps thereon, problems such as a loss of focus may arise in the photolithography process.

One solution, described in JP-A 2004-193185, is a process for manufacturing a SOI substrate in which ions are implanted to the SOI region after portions of the silicon substrate surface, i.e., bulk regions, have been masked with a surface oxide film, following which the thickness of the surface oxide film is reduced and annealing is carried out in an oxidizing atmosphere, thereby forming a BOX layer within the substrate. That is, during annealing treatment, a surface oxide layer forms on the surface of the substrate in the SOI region, and this layer is lifted up on the surface side with formation of the BOX layer at the interior. However, the presence of an oxide film of a given thickness within the bulk regions alleviates the size of the resulting step. In this way, by removing the oxide film or surface oxide layer in a post-annealing operation, a relatively flat substrate surface can be achieved.

Yet, in silicon substrates obtained by such a method of manufacture, as noted above, when a BOX layer is formed, the BOX layer expands and the surface of the substrate swells, while at the same time oxygen diffuses and oxidation proceeds at the surface of the substrate, forming a surface oxide layer. At edge areas of the BOX layer in particular, oxidation is accelerated by the diffusion also of oxygen from the bulk regions, thus increasing the thickness of the film in the edge areas of the BOX layer. Depending on the degree of surface oxide layer formation, the thicker edge areas of the BOX layer may reach the surface of the substrate and connect to the surface oxide layer. Removal of the surface oxide layer may cause the BOX layer which projects out to the substrate surface being overetched together with the surface oxide layer, leading to the formation of cavities at the substrate surface, which may have detrimental effects such as particle formation during device fabrication.

It is therefore an object of the present invention to form an oxide layer, i.e., a BOX layer, at the interior of the silicon substrate while preventing any thickening of the BOX layer that may allow edge areas of the BOX layer to reach the substrate surface.

SUMMARY OF THE INVENTION

Accordingly, the invention provides a process for manufacturing a silicon-on-insulator substrate including a single-crystal silicon substrate in which an oxide layer, i.e., a BOX layer, has been locally buried, which process includes forming a step on the silicon substrate so that a region corresponding to the oxide layer (BOX layer) has a greater surface height than other regions; then implanting oxygen ions in the silicon substrate so as to form the oxide layer (BOX layer).

That is, a step is provided on the silicon substrate prior to implanting oxygen ions in the silicon substrate. Oxygen ions are then implanted from a region having a high surface height, after which annealing treatment (heat treatment) is administered, thereby forming a BOX layer within the silicon substrate. Here, because the surface of the silicon substrate region corresponding to the BOX layer is formed so as to be higher than the surfaces of other regions, even though the surface oxide layer advances in the depth direction with oxidation during annealing, it can be kept within the protruding region of the step, enabling the formation of a concavity at the surface of the finished SOI substrate to be suppressed. Consequently, a BOX layer can be formed at the interior of the silicon substrate without lowering the device characteristics.

It is preferable to set the height of this step so as to match as closely as possible the growth region (in the depth direction) by the surface oxide layer that forms under given annealing conditions. Doing so will enable the step to be eliminated by the removal of the surface silicon oxide after annealing.

A step can easily be formed by depositing a resist film on the surface of the region corresponding to the oxide layer in the silicon substrate so as to mask this region, and removing the surface of the silicon substrate in regions other than this resist film by dry etching. It should be noted that the etching operation is not limited to dry etching.

However, during oxygen ion implantation, the surface of the silicon substrate may undergo erosion due to, for example, the sputtering action by the oxygen ions, resulting in the formation of concavities. Hence, in working the invention, between formation of the step and the implantation of oxygen ions, it is advantageous to first form on the surface of the step an oxide film, then form a nitride film and subsequently form a mask oxide film over the nitride film in regions other than the region corresponding to the BOX layer. By forming a nitride film on the substrate surface in this way, the surface of the substrate protrusion where a mask oxide film is not formed is protected by the nitride film, suppressing defects such as indentations in the corners due to the sputtering effect and making it possible to more reliably prevent a decline in the device characteristics.

Also, by having a nitride film formed on the low sides of the step opposite the ends of the BOX layer, that is, on the substrate surface in regions other than the region corresponding to the BOX layer, during annealing, for example, oxygen penetration and diffusion from the surface of the substrate in these regions can be prevented, thus making it possible to suppress the formation of a surface oxide layer and an increase in film thickness at the edges of the BOX layer. Hence, even if, for example, the surface oxide layer is removed after annealing, because the BOX layer does not project out to the substrate surface due to thickening at the edges of the BOX layer, defects such as cavities do not arise within the silicon substrate due to overetching of the BOX layer, making it possible to reliably prevent problems such as particle generation during device fabrication.

Preferably, the inventive process for manufacturing a silicon-on-insulator substrate additionally includes, following the implantation of oxygen ions in the silicon substrate: a first removal step which removes the nitride film on the region corresponding to the BOX layer; an annealing step which, after the first removal step, heat-treats the silicon substrate in an oxidizing atmosphere to form the BOX layer (oxide layer) within the silicon substrate and to form a surface oxide layer on the surface of the silicon substrate region corresponding to the BOX layer; and a second removal step which, after the annealing step, removes the nitride film, the surface oxide layer and the mask oxide film from the silicon substrate.

The inventive process is able to suppress the formation of a surface step between the SOI region and the bulk region, and moreover is able to form a BOX layer at the interior of the silicon substrate without giving rise to cavities in the substrate surface due to the projection of the BOX layer edges out to the substrate surface.

DETAILED DESCRIPTION OF THE INVENTION

An embodiment of the process for manufacturing a SOI substrate according to the present invention is described below in conjunction with the diagrams. Each of FIGS. 1 to 8, which together schematically illustrate the inventive process for manufacturing SOI substrates, is a partial longitudinal sectional diagram following the completion of a major step in the manufacturing process.

Figure 1:
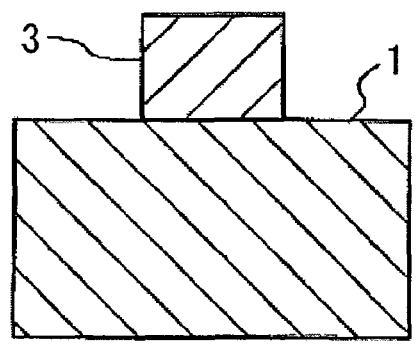
FIG. 1, which schematically illustrates the process for manufacturing a SOI substrate according to the invention, is a partial longitudinal sectional view following the completion of an operation in which a resist film is deposited on the surface of the region corresponding to the oxide layer to be formed within the single-crystal silicon substrate.

In this embodiment of the inventive process for manufacturing a SOI substrate, first, as shown in FIG. 1, an organic resist film 3 is deposited on the surface of a horizontally disposed single-crystal silicon substrate 1 in accordance with a pattern formed by lithography. The single-crystal silicon substrate 1 may be obtained by using, for example, the Czochralski (CZ) method to pull a single-crystal silicon ingot, and slicing a thin wafer along a plane orthogonal to the crystal axis (the (100) plane in the crystal structure of the single-crystal silicon). It is also possible to cut the single-crystal silicon substrate from a single-crystal silicon ingot or a single-crystal silicon plate obtained by a method other than the CZ method, such as the float-zone (FZ) method. Moreover, the substrate may be an epitaxial substrate obtained by the epitaxial growth of silicon on the surface of a substrate.

Figure 2:
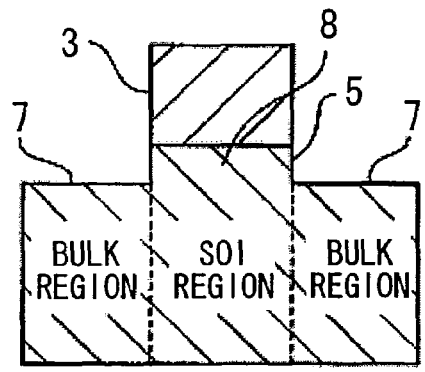
FIG. 2, which schematically illustrates the inventive process for manufacturing a SOI substrate, is a partial longitudinal sectional view following the completion of an operation in which the surface of the silicon substrate in regions other than where the resist film has been deposited is removed by dry etching to form a step.

Next, as shown in FIG. 2, using the resist film 3 as the mask, anisotropic etching is carried out perpendicular to the horizontal plane of the single-crystal silicon substrate 1, such as by reactive ion etching (RIE). Here, the region in the depth direction of the area on which the resist film 3 has been formed, i.e., the SOI region 5, is the region where ions will be implanted in a later step. This SOI region 5 is formed between bulk regions 7 that are adjacent on both sides. In this step, the etching depth in the bulk region 7 is, for example, 0.2 to 0.3 μm. This becomes the size of the step represented by a protrusion 8 that is formed on the surface of the single-crystal silicon substrate. This step size may be set as appropriate based on such factors as the film thickness to which the subsequently described BOX layer will be formed. By forming such a step, or protrusion, 8 on the silicon substrate, the surface of the SOI region 5 becomes higher than the surface of the bulk regions 7. The etching operation is preferably carried out by dry etching as in the present embodiment, although wet etching may instead be used.

Figure 3:
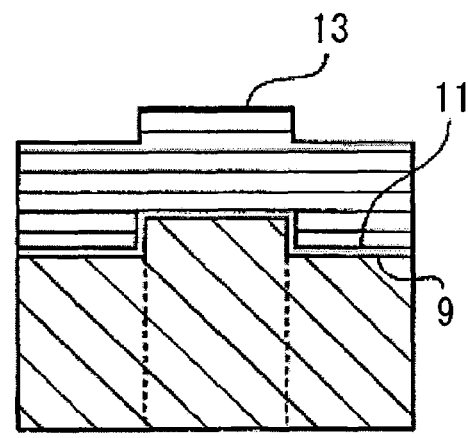
FIG. 3, which schematically illustrates the inventive process for manufacturing a SOI substrate, is a partial longitudinal sectional view following the completion of an operation in which a silicon oxide film, a silicon nitride film and a silicon oxide film are successively formed on the surface of the single-crystal silicon substrate in which a step has been formed.

Next, as shown in FIG. 3, the resist film 3 is removed, then a silicon oxide film 9 with a thickness of, for example, 20 nm is formed over the entire surface of the single-crystal silicon substrate 1 by chemical vapor deposition (CVD), following which a silicon nitride film 11 having a thickness of, for example, 50 to 100 nm is formed over the silicon oxide film 9. Another silicon oxide film 13 having a thickness of, for example, 1 μm is then deposited over the silicon nitride film 11. In this way, a mask film composed of the silicon oxide film 13 is ultimately formed on the surface of the single-crystal silicon substrate 1.

Figure 4:
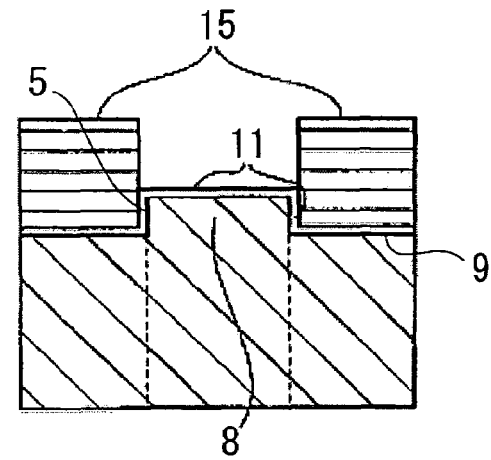
FIG. 4, which schematically illustrates the inventive process for manufacturing a SOI substrate, is a partial longitudinal sectional view following the completion of an operation in which a mask oxide film is formed on the nitride film in other regions (regions other than the region corresponding to the oxide layer).

Next, as shown in FIG. 4, using a lithographic technique, the silicon oxide film 13 opposite the SOI region 5 is removed by etching (e.g., RIE) and a mask made of a silicon oxide film 15 is formed. Here, the silicon oxide film 9 remains as formed at the top and the sidewalls of the SOI region 5, and the silicon nitride film 11 remains as formed on the surface of the SOI region 5, i.e., at the top and the sidewalls of the protrusion 8. On the surface of the bulk regions on either side of the SOI region 5, the silicon oxide film 15 (the mask composed of a silicon oxide film) remains over the silicon oxide film 9 and the silicon nitride film 11.

Figure 5:
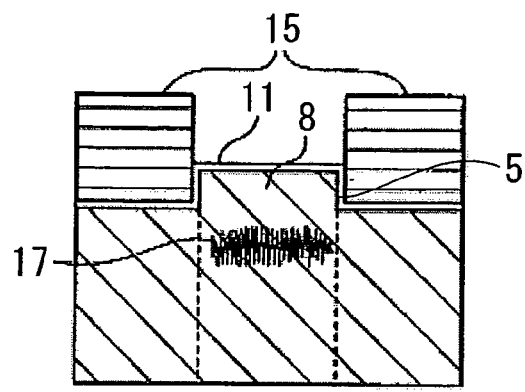
FIG. 5, which schematically illustrates the inventive process for manufacturing a SOI substrate, is a partial longitudinal sectional view following the completion of an operation in which oxygen ions are implanted in the SOI region of the silicon substrate.

Next, as shown in FIG. 5, oxygen ions are vertically implanted from the top side of the single-crystal silicon substrate 1. Exemplary oxygen ion implantation conditions at this time are an implantation dose of from $1 \times 10^{17}$ to $2 \times 10^{18}/cm^2$, and preferably from $2 \times 10^{17}$ to $5 \times 10^{17}/cm^2$, and an implantation energy of from 20 to 240 keV, and preferably from 60 to 200 keV. The oxygen ions are implanted into the SOI region 5 that is not masked by the silicon oxide film (mask oxide film) 15, and stop at a predetermined depth range indicated by the symbol 17 in the diagram.

Figure 6:
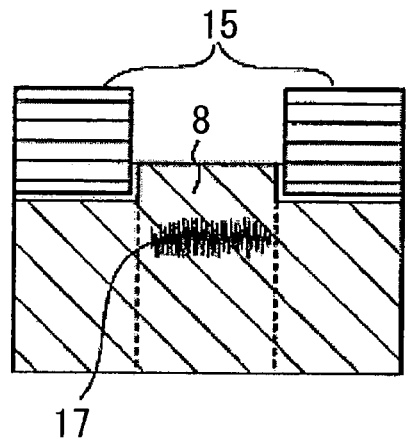
FIG. 6, which schematically illustrates the inventive process for manufacturing a SOI substrate, is a partial longitudinal sectional view following the completion of a first removal step in which the nitride film formed on the region corresponding to the oxide layer is removed.
Figure 7:
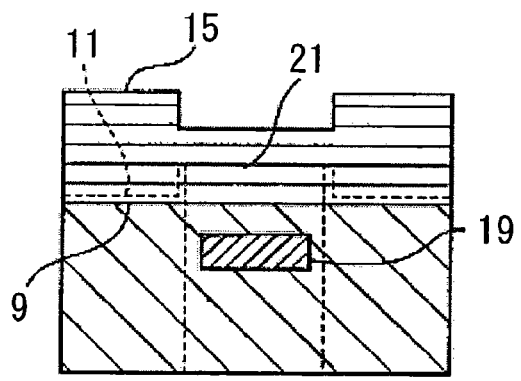
FIG. 7, which schematically illustrates the inventive process for manufacturing a SOI substrate, is a partial longitudinal sectional view following the completion of an annealing step in which the oxygen ion-implanted silicon substrate is heat-treated in an oxidizing atmosphere to form an oxide layer within the silicon substrate and to form a surface oxide layer on the surface of the region corresponding to the oxide layer within the silicon substrate.

Next, as shown in FIG. 6, in a first removal step, the silicon nitride film (nitride film) 11 on the top side of the protrusion 8 is removed by RIE or some other suitable etching process. Then, as shown in FIG. 7, with the silicon nitride film 11 removed, annealing (heat treatment) is carried out for a given length of time in an oxidizing atmosphere at an elevated temperature (e.g., 1200 to 1300° C.), causing the oxygen that has been implanted in the SOI region 5 to bond with silicon and thereby forming a BOX layer 19. At the same time, the protrusion 8 in the SOI region 5 which has not been masked by a silicon oxide film 15 is oxidized from the surface side by the oxidizing gases to a depth that is close to horizontal with the silicon nitride film 11 in the bulk region 7, becoming a silicon oxide layer 21.

Figure 8:
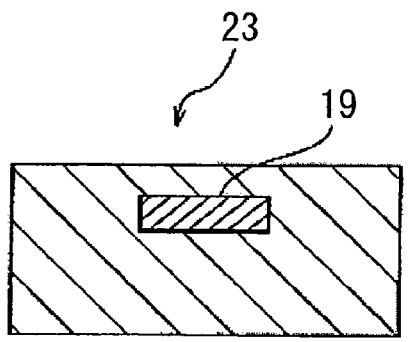
FIG. 8, which schematically illustrates the inventive process for manufacturing a SOI substrate, is a partial longitudinal sectional view following the completion of a second removal step in which the nitride film, the surface oxide film and the mask oxide film on the silicon substrate are removed.

Next, as shown in FIG. 8, in a second removal step, the silicon oxide layer (surface oxide layer) 21, silicon oxide film (mask oxide film) 15, silicon nitride film (nitride film) 11 and silicon oxide film (oxide film) 9 are removed by a predetermined etching operation, giving a SOI substrate 23 having a surface of a predetermined flatness. It is preferable for the etching to be carried out here by a wet etching process.

The distinctive features of this embodiment of the foregoing SOI substrate manufacturing process, and the effects provided thereby, are now explained.

First, in this embodiment, prior to implanting the oxygen ions in the single-crystal silicon substrate 1, a protrusion 8 in the form of a step (step 8) is formed so as to make the surface of the SOI region 5 higher than the surface of the bulk regions 7. As a result, during annealing following ion implantation, even though the surface of the SOI region 5 has been oxidized and a silicon oxide layer 21 has been formed, this silicon oxide layer 21 can be stopped within the range of the protrusion 8. Hence, by removing the protrusion 8 which, after annealing, has become entirely an oxide layer, a surface step does not arise between the SOI region and the bulk region at the surface of the finished SOI substrate 23, obviating problems such as loss of focus during photolithography. The size of the step may be set as desired. For example, it may be set as appropriate for the silicon oxide layer 21 forming region and the BOX layer thickness which vary with the annealing conditions, and as appropriate for the length of the etching treatment in which this silicon oxide layer 21 is removed. Also, in this embodiment, because the height of the protrusion 8, i.e., the size of the step, is from 0.2 to 0.3 μm, for example, when the corners of the protrusion 8 are eroded by the sputtering action during ion implantation, there is a possibility of depressions arising on the surface of the SOI substrate 23.

Hence, oxygen ion implantation is carried out after the silicon nitride film 11 has been formed on the protrusion 8 in the SOI region 5. In this way, the corners of the protrusion 8 are protected by the silicon nitride layer 11, reducing the extent of defects such as depressions at the corners due to the sputtering effect, and making it possible to suppress a decline in the device characteristics.

Also, in this embodiment, annealing is carried out after formation of the silicon nitride film 11 on the surface of the bulk region 7. The diffusion of oxygen from the surface of the bulk region 7 to the underlying silicon can thus be prevented, making it possible to resolve the problem of an increased film thickness at the edges of the BOX layer. If annealing is carried out without the formation of a silicon nitride film 11 on the surface of the bulk region 7, oxygen will also diffuse from the bulk region, especially at the edges of the BOX layer, accelerating oxidation and thus increasing the film thickness at the edge of the BOX layer. This makes it possible to keep the edges of the BOX layer from projecting out onto the substrate surface, as a result of which cavities do not arise in the substrate surface and adverse effects such as particle generation are not imparted during device fabrication. Also, it is preferable to form a silicon oxide film 9 below the silicon nitride film 11. This enables greater alleviation of stress than when the silicon nitride film 11 is formed directly on the silicon base material.

As noted above, in this embodiment, prior to oxygen ion implantation, a step-like protrusion 8 is formed on the surface of the SOI region 5 of the single-crystal silicon substrate 1, oxygen ions are implanted in the SOI region 5, then annealing is administered. As a result, in the finished SOI substrate 23, no surface step arises between the SOI region 5 and the bulk region, thus making it possible to prevent problems such as a loss of focus in the photolithography step. Moreover, because a silicon nitride film is formed on the surface of the substrate prior to oxygen ion implantation, the formation of depressions at the surface of the SOI region 5 during oxygen ion implantation can be prevented and the diffusion of oxygen to the silicon base material at the surface of the bulk region 7 can be suppressed. As a result, the BOX layer can be kept from projecting out to the surface of the substrate due to thickening of the film at the edges of the BOX layer. Hence, cavities do not arise at the substrate surface during device fabrication on the finished SOI substrate 23, making it possible to prevent detrimental effects such as particle generation.

Thus, in the process according to this embodiment, prior to forming an oxide layer by implanting oxygen ions in the silicon substrate, a step is formed which makes the surface height in a region corresponding to the oxide layer within the silicon substrate higher than the surface height in other regions. As a result, in the finished SOI substrate, there is no surface step between the SOI region and the bulk region. Moreover, a partial SOI substrate which is free of cavities in the substrate surface due to the projection of the BOX layer edges out to the substrate surface can be formed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A process for manufacturing a silicon-on-insulator substrate including a single-crystal silicon substrate in which an oxide layer is provided at the interior of a silicon substrate by the local implantation of oxygen ions in the single-crystal silicon substrate and annealing the single-crystal silicon substrate, the process comprising:
    forming a step on the silicon substrate so that a region corresponding to the oxide layer has a greater surface height than other regions;
    forming an oxide film on the surface of the step;
    forming a nitride film over the oxide film and over said other regions;
    forming a mask oxide film on the nitride film in said other regions; and
    implanting oxygen ions in the silicon substrate so as to form the oxide layer.

2. The process according to claim 1, wherein the step is formed by depositing a resist film on a surface of the region of the silicon substrate corresponding to the oxide layer, then removing the surface of the silicon substrate in regions other than the resist film by dry etching.

3. The process according to claim 1, further comprising:
    a first removal step which, after the implantation of oxygen ions in the silicon substrate, removes the nitride film which is formed after forming the oxide layer on the surface of the step;
    an annealing step which, after the first removal step, heat-treats the silicon substrate in an oxidizing atmosphere to form the oxide layer within the silicon substrate and to form a surface oxide layer on the surface of the silicon substrate region corresponding to the oxide layer; and
    a second removal step which, after the annealing step, removes the nitride film, the surface oxide layer and the mask oxide film from the silicon substrate.

* * * * *